(12) United States Patent
Künne et al.

(10) Patent No.: US 12,182,041 B2
(45) Date of Patent: Dec. 31, 2024

(54) MANIPULATION ZONE FOR QUBITS IN QUANTUM DOTS

(71) Applicants: Rheinisch-Westfälische Technische Hochschule (RWTH) Aachen, Aachen (DE); Forschungszentrum Jülich GmbH, Jülich (DE)

(72) Inventors: Matthias Künne, Aachen (DE); Hendrik Bluhm, Aachen (DE); Lars Schreiber, Aachen (DE)

(73) Assignees: Rheinisch-Westfälische Technische Hochschule (RWTH) Aachen, Aachen (DE); Forschungszentrum Jülich GmbH, Jülich (DE)

( * ) Notice: Subject to any disclaimer, the term of this patent is extended or adjusted under 35 U.S.C. 154(b) by 372 days.

(21) Appl. No.: 17/761,885

(22) PCT Filed: Sep. 21, 2020

(86) PCT No.: PCT/DE2020/100810
§ 371 (c)(1),
(2) Date: Mar. 18, 2022

(87) PCT Pub. No.: WO2021/052537
PCT Pub. Date: Mar. 25, 2021

(65) Prior Publication Data
US 2022/0414516 A1      Dec. 29, 2022

(30) Foreign Application Priority Data

Sep. 20, 2019  (DE) ..................... 10 2019 125 351.9
Jun. 10, 2020  (DE) ..................... 10 2020 115 493.3

(51) Int. Cl.
*H01L 29/66*       (2006.01)
*G06F 13/20*       (2006.01)
(Continued)

(52) U.S. Cl.
CPC ............. *G06F 13/20* (2013.01); *G06N 10/40* (2022.01); *H01L 29/423* (2013.01);
(Continued)

(58) Field of Classification Search
CPC . G06N 10/40; H01L 29/423; H01L 29/42316; H03K 17/92
See application file for complete search history.

(56) References Cited

U.S. PATENT DOCUMENTS 8,164,082 B2    4/2012  Friesen
11,171,225 B2   11/2021 Voinigescu et al.
(Continued)

FOREIGN PATENT DOCUMENTS

AU    2007200501 A1    8/2008
DE    102019202661 A1   8/2020
(Continued)

OTHER PUBLICATIONS

Electron spins in few-electron, lateral quantum dots, Laurens Henry Willems Van Beveren, (Tech Univ Delft), Thesis (Year: 2005).
(Continued)

*Primary Examiner* — Thao P Le
(74) *Attorney, Agent, or Firm* — Smartpat PLC

(57) ABSTRACT

An electronic component is formed by a semiconductor component or a semiconductor-like structure having gate electrode assemblies for manipulating the quantum state of qubits in quantum dots. It comprises a substrate comprising a two-dimensional electron gas or electron hole gas. Electrical contacts connect the gate electrode assemblies to voltage sources. A first gate electrode assembly having gate electrodes is arranged on a surface of the electronic component to generate movable potential wells in the substrate. A second gate electrode assembly serves to generate a potential barrier, which is adjacent to the first gate electrode
(Continued)

assembly. The gate electrode assemblies have parallel electrode fingers, whereby the electrode fingers of the first gate electrode assembly are periodically and alternately interconnected in order to effect an almost continuous movement of the potential wells through the substrate.

14 Claims, 4 Drawing Sheets

(51) Int. Cl.
*G06N 10/40* (2022.01)
*H01L 29/423* (2006.01)
*H03K 17/92* (2006.01)
*H10N 60/10* (2023.01)
*H10N 69/00* (2023.01)

(52) U.S. Cl.
CPC .. *H01L 29/42316* (2013.01); *H01L 29/66977* (2013.01); *H03K 17/92* (2013.01); *H10N 60/11* (2023.02); *H10N 60/128* (2023.02); *H10N 69/00* (2023.02); *G06F 2213/40* (2013.01)

(56) References Cited

U.S. PATENT DOCUMENTS

| | | | |
|---|---|---|---|
| 2008/0185576 A1 | 8/2008 | Hollenberg et al. | |
| 2010/0301216 A1* | 12/2010 | Vardi | H01L 31/112 257/E31.073 |
| 2015/0279981 A1 | 10/2015 | Eriksson et al. | |
| 2016/0125310 A1 | 5/2016 | Hollenberg et al. | |
| 2016/0275410 A1 | 9/2016 | Rogge et al. | |
| 2017/0317203 A1 | 11/2017 | Petta et al. | |
| 2018/0226451 A1 | 8/2018 | Dzurak et al. | |
| 2020/0168777 A1* | 5/2020 | Kang | H01L 33/36 |
| 2020/0176569 A1 | 6/2020 | Singh et al. | |
| 2020/0312990 A1 | 10/2020 | Roberts et al. | |
| 2020/0388723 A1* | 12/2020 | Ahmed | H01L 33/42 |
| 2021/0279134 A1 | 9/2021 | Versluis et al. | |
| 2021/0327865 A1* | 10/2021 | Yamazaki | H01L 25/0657 |
| 2022/0005943 A1 | 1/2022 | Roberts et al. | |
| 2022/0131109 A1* | 4/2022 | Tong | H10K 59/878 |
| 2022/0172097 A1 | 6/2022 | Langrock et al. | |
| 2023/0197833 A1 | 6/2023 | Thomas et al. | |

FOREIGN PATENT DOCUMENTS

| | | |
|---|---|---|
| EP | 2075745 A1 | 7/2009 |
| EP | 2560133 A1 | 2/2013 |
| EP | 3016035 A3 | 1/2019 |
| EP | 3016035 B1 | 1/2019 |
| EP | 4075153 A1 | 10/2022 |
| JP | S5994458 A | 5/1984 |
| JP | S5994458 U | 6/1984 |
| WO | 2014146162 A1 | 9/2014 |
| WO | 2017020095 A1 | 2/2017 |
| WO | 2017213651 A1 | 12/2017 |
| WO | 2018062991 A1 | 4/2018 |
| WO | 2018236403 A1 | 12/2018 |

OTHER PUBLICATIONS

G.J. Schinner et al., "Confinement and Interaction of Single Indirect Excitons in a Voltage-Controlled Trap Formed Inside Double InGaAs Quantum Wells", New Journal of Physics, vol. 110, issue. 12, pp. 127403-127408, Mar. 19, 2013.

High, A. A., et al. "Trapping indirect excitons in a GaAs quantum-well structure with a diamond-shaped electrostatic trap." Physical review letters 103.8 (2009): 087403.

Horsman, Clare, et al. "Surface code quantum computing by lattice surgery." New Journal of Physics 14.12 (2012): 123011.

Künne et al., co-pending U.S. Appl. No. 17/642,484, national phase entry of PCT/DE2020/100812.

Künne et al., co-pending U.S. Appl. No. 17/642,527; national phase entry of PCT/DE2020/100811.

Künne et al., co-pending U.S. Appl. No. 17/642,677; national phase entry of PCT/DE2020/100809.

Künne et al., co-pending U.S. Appl. No. 17/761,832; national phase entry of PCT/DE2020/100814.

Künne et al., co-pending U.S. Appl. No. 17/636,522; national phase entry of PCT/DE2020/100766.

Schinner, G. J., et al. "Electrostatically trapping indirect excitons in coupled In x Ga 1-x as quantum wells." Physical Review B 83.16 (2011): 165308.

Veit Langrock, Numerical and theoretical investigation of long-range coherent electron shuttling devices in Silicon/Silicon-Germanium quantum wells for scalable quantum computing, Nov. 30, 2017, retrieved online from https://www.quantuminfo.physik.rwth-aachen.de/global/show_document.asp?id=aaaaaaaabbnooi.

* cited by examiner

MANIPULATION ZONE FOR QUBITS IN QUANTUM DOTS

TECHNICAL FIELD

The disclosure relates to an electronic component which is formed by a semiconductor component or a semiconductor-like structure having gate electrode assemblies for manipulating the quantum state of qubits in quantum dots. The disclosure further relates to a method for such an electronic component.

BACKGROUND

Conventional computers use semiconductor components with integrated circuits. These circuits always work with systems which are based on a logical "0" or "1"—i.e. the switch is "on" or "off". In semiconductor memories, this is realized in that the potential is either above or below a threshold value. These two states form the smallest unit in computers and are referred to as "bits".

These semiconductor components often consist of doped silicon elements in order to realize the circuits. For example, transistor circuits can be arranged in such semiconductor components and linked to form a logic circuit. Through continuously improving chemical and physical manufacturing processes, these semiconductor components can now be produced with increasingly extreme compactness. However, this compactness has reached its physical limits. The density of the circuits as well as the temperature often leads to problems in such semiconductor components. In this manner optimizations in particular can be achieved through several layer models, higher switching speeds, or the selection of the semiconductor material. Nevertheless, the computing power is often insufficient for many applications, e.g. in cryptographic technology or when calculating weather or climate models, due to the enormous amounts of data.

To significantly increase computing power, models for so-called quantum computers have long been known. For a variety of reasons, though, it has not yet been technically possible to implement them. The models of quantum computers are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

The principle of electron spin qubits is always the same, regardless of the material system selected. A semiconductor heterostructure serves as the substrate in this case. The semiconductor heterostructure comprises a two-dimensional electron gas (2DEG). Semiconductor heterostructures are monocrystalline layers of semiconductors with different compositions grown on top of each other. These layer structures provide numerous technically relevant quantization effects in terms of their electronic and optical properties. For this reason, they are particularly suitable for use in the production of microelectronic components. The most important combination of materials at the present time for the production of semiconductor heterostructures is the GaAs/AlGaAs system.

Semiconductor heterostructures form so-called quantum films at the interfaces between different materials. These arise in particular because of the different energy levels in the two materials. The defined energy distribution resulting therefrom causes charge carriers from the surrounding area to collect in the quantum film. Their freedom of movement is largely restricted to the layer in the film, and they form the two-dimensional electron gas (2DEG).

A nanoscopic material structure is referred to as a quantum dot. Semiconductor materials are particularly suitable for this. The mobility of the charge carriers, both electrons and holes, is so restricted in a quantum dot that their energy can no longer assume continuous values, and can thus only assume discrete values. Using nanoscale gate electrodes (also referred to as gates), which are applied to the surface of the component, the potential landscape within the two-dimensional electron gas (2DEG) is shaped in such a manner that individual electrons can be captured in the quantum dots. The spins of these electrons then serve as the basis for the formation of a logical qubit.

Electronic states can be split with regard to their spin state by means of an external magnetic field (Zeeman effect) and thus addressed separately. The spins of these electrons then serve as the basis of eigenstates for the purpose of forming a logical qubit. Furthermore, superimposed states of these two eigenstates can also be realized due to quantum mechanical effects.

Methods for manipulating single qubits via electron spin resonance (ESR) or electron dipole spin resonance (EDSR) are known. Two-qubit operations are known via exchange interaction.

US 2017/0317203 A1 discloses a quantum dot device comprising at least three conductive layers and at least two insulating layers. The three conductive layers are electrically insulated from one another. It is described there that one conductive layer is composed of a different material than the other two conductive layers. The conductive layers can include or be composed entirely of aluminum, gold, copper, or polysilicon, for example. The insulating layers, on the other hand, are composed of silicon oxide, silicon nitride, and/or aluminum oxide, for example. The connections between the conductive layers and the insulating layers can cause, inter alia, individual electrons to be shuttled through quantum dots of the device using voltage pulses.

In this quantum dot device, an electron is confined in a potential well. Through quantum mechanical tunneling, an electron is moved from quantum dot to quantum dot. This can lead to inaccuracies or falsifications of the information regarding the quantum mechanical state when an electron moves over longer distances.

WO 2017/020095 A1 discloses a scalable architecture for a processing device for performing quantum processing. The architecture is based on full-silicon CMOS fabrication technology. Transistor-based control circuits are used together with floating gates to operate a two-dimensional array of qubits. The qubits are defined by the spin states of a single electron, which is trapped in a quantum dot. A higher level is described here, meaning how individual qubits can be electrically driven, for example via transistors, etc., including qubit operation and readout. Although reference is made to a "scalable architecture", the array shown does not allow any real scaling, meaning inter alia integration of cryogenic electronics, since no space can be created between the qubits.

U.S. Pat. No. 8,164,082 B2 describes a spin bus quantum computer architecture comprising a spin bus comprising of a plurality of strongly coupled and always on qubits defining a string of spin qubits. A plurality of information-bearing qubits are arranged adjacent to a qubit of the spin bus. Electrodes are formed to the information-bearing qubits and the spin bus qubits to allow control of the establishment and breaking of coupling between qubits in order to allow control of the establishment and breaking of coupling between each information-bearing qubit and the spin bus qubit adjacent to it. The spin bus architecture allows rapid and reliable long-range coupling of qubits.

EP 3 016 035 B1 describes a processing apparatus and methods to operate the same, and particularly, but not exclusively, the invention relates to a quantum processing apparatus which is controllable to perform adiabatic quantum computations.

A quantum processor has the following features: a plurality of qubit elements and a control structure comprising a plurality of control members, wherein each control member is arranged to control a plurality of qubit elements. The control structure is controllable to perform quantum computation using the qubit elements, wherein a quantum state of the qubit elements is encoded in the nuclear or electron spin of one or more donor atoms. The donor atoms are arranged in a plane embedded in a semiconducting structure. A first set of donor atoms is arranged to encode quantum information related to the quantum computation. A second set of donor atoms is arranged to facilitate electromagnetic coupling between one or more of the first set of donor atoms. The donor atoms of the first set are arranged in a two-dimensional matrix arrangement. The plurality of control members comprises a first set of elongated control members arranged in a first plane above the plane comprising the donor atoms. A second set of elongated control members are provided which are arranged in a second plane below the plane comprising the donor atoms.

To implement a universal quantum computer, it must be possible to couple the qubits over distances of at least a few micrometers, in particular to create space for local control electronics. Structures and structural elements must be provided which allow a quantum dot to be transported to different targets in order to be able to construct logic circuits. There are already approaches in the prior art in which one or two-dimensional arrays have been built from separate quantum dots, through which electrons can then be transported. Due to the very large number of gate electrodes required and corresponding voltages to be set, coupling over several micrometers is impossible to implement or can only be implemented with significant effort using this approach.

While operations on individual qubits can already be checked and evaluated to a satisfactory extent, the ability to couple qubits is probably the main problem yet to be solved in order to realize complex logic circuits and implement a universal quantum computer.

SUMMARY

An object of the disclosure is to eliminate the disadvantages of the prior art and to provide an electronic component which allows logic circuits to be realized with quantum dots, whereby the quantum dots are intended to assume a defined quantum mechanical state.

The object is achieved in an electronic component which is formed by a semiconductor component or a semiconductor-like structure having gate electrode assemblies for manipulating the quantum state of qubits in quantum dots, comprising a) a substrate with a two-dimensional electron gas or electron hole gas;
b) electrical contacts for connecting the gate electrode assemblies to voltage sources;
c) a first gate electrode assembly having gate electrodes, which is arranged on a surface of the electronic component, for producing movable potential wells in the substrate;
d) a second gate electrode assembly for generating a potential barrier, which is adjacent to the first gate electrode assembly;
e) the gate electrode assemblies have parallel electrode fingers, whereby
f) the electrode fingers of the first gate electrode are interconnected in a periodically alternating manner, which bring about an almost continuous movement of the potential well through the substrate; and
g) a manipulator that sets the qubit to a definable quantum state in a manipulation zone, wherein the manipulation zone is provided in the adjacent region, which is formed by the first and second gate electrode assembly.

The object is further achieved by a method for such an electronic component in which the quantum dot or quantum dots can be moved into and out of the manipulation zone by means of the first or third gate electrode assemblies.

In general, qubits are realized by electron spins. The invention also utilizes the fact that a quantum mechanical state is set for a quantum dot by the manipulator in the manipulation zone. The quantum mechanical state defined in this manner can be transported through the substrate over a longer distance. For this purpose, the quantum dot is confined in the potential well, which is generated in a suitable manner by the gate electrode assembly. The potential well then moves continuously and in a directed manner through the substrate and carries the quantum dot with its quantum mechanical state over the distance. To enable continuous movement of the potential well, the electrode fingers of the gate electrodes are connected accordingly. A quantum dot is transported to the static potential well in the manipulation zone via the movable potential wells.

In an advantageous embodiment of the electronic component, the manipulator comprises means for a switchable magnetic field in the area of the manipulation zone for the purpose of manipulating the qubit. The magnetic field serves to split the electronic states with respect to the spin. These new eigenstates thus serve as a basis for forming a logical qubit.

In a further advantageous embodiment of the electronic component, the manipulator comprises means for generating an oscillating magnetic field or a gradient magnetic field in the manipulation zone. An electron is located in an in-plane magnetic field gradient, whereby the magnetic field gradient is used to be able to switch between the eigenstates split with respect to the spin.

A preferred embodiment of the electronic component is obtained in that the manipulator contains a microwave generator, which radiates microwaves into the manipulation zone for the purpose of manipulating the quantum dot. This measure serves to allow a quantum dot to be moved in the manipulation zone until a desired quantum state has been set. Microwaves are irradiated via a gate electrode, for example. These microwaves distort the potential in a controlled manner so that an electron begins to oscillate in a controlled manner in the magnetic field. Due to spin-orbit coupling, it is then possible to switch between the two spin states.

In a particular variant of the electronic component, the manipulator comprises a third gate electrode assembly with gate electrodes for transporting a quantum dot by means of a potential well, which is arranged adjacent to a surface of the electronic component and to the manipulation zone. As a result, two quantum dots can be transported simultaneously to the manipulation zone.

In another embodiment of the electronic component, a fourth gate electrode assembly is additionally provided in the area of the manipulation zone to generate another switchable potential barrier. An additional static potential well can be generated with this measure. This produces, for example, a double potential well, which is particularly suitable for the manipulation of the quantum states of qubits in quantum dots or the quantum states of two qubits in quantum dots by means of an exchange interaction.

In a preferred embodiment of the electronic component, a gate electrode assembly comprises two parallel gate electrodes, which form a channel-like structure. This measure serves to ensure that the potential well can only move along a certain path in the substrate.

In an advantageous embodiment of such an electronic component, the substrate comprises gallium arsenide (GaAs) and/or silicon germanium (SiGe). These materials are able to form a two-dimensional electron gas in which quantum dots can be generated and moved. In the case of gallium arsenide, the quantum dots are occupied by electrons. In the case of silicon germanium, the quantum dots are occupied by holes that are missing an electron.

In a further preferred embodiment of the electronic component, the respectively interconnected gate electrodes are configured such that a periodic and/or phase-shifted voltage can be applied to them. This measure enables the potential well to be guided continuously through the substrate. A quantum dot located in the potential well can thus be transported through the substrate with the potential well while retaining its original quantum mechanical state.

In a preferred embodiment of the electronic component, at least every third electrode finger of a gate electrode is connected together. This is intended to ensure that the potential well is always guaranteed over at least one period through which the potential well is moved. Only in this way is it possible to ensure continuous movement of the potential well with the quantum dot. In principle, other combinations are also possible when interconnecting gate electrodes, as long as the potential well can be moved together with the quantum dot. Correspondingly, an advantageous embodiment for the method for an electronic component is obtained in that at least every third gate electrode is connected together and a voltage is applied periodically to the interconnected gate electrodes.

In a further advantageous embodiment of the electronic component, means are provided for connecting two qubits of a quantum computer. Transporting the states of quantum dots over greater distances is particularly suitable for quantum computers. In quantum computers, it is necessary to connect qubits to one another. For this reason, the electronic component must provide contacts to connect at least two qubits to one another in order to transfer the quantum states of the quantum dots from one qubit to another qubit.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is best defined by the appended claims. The prior art cited is considered part of the disclosure relating to the present invention.

DETAILED DESCRIPTION

Figure 1:
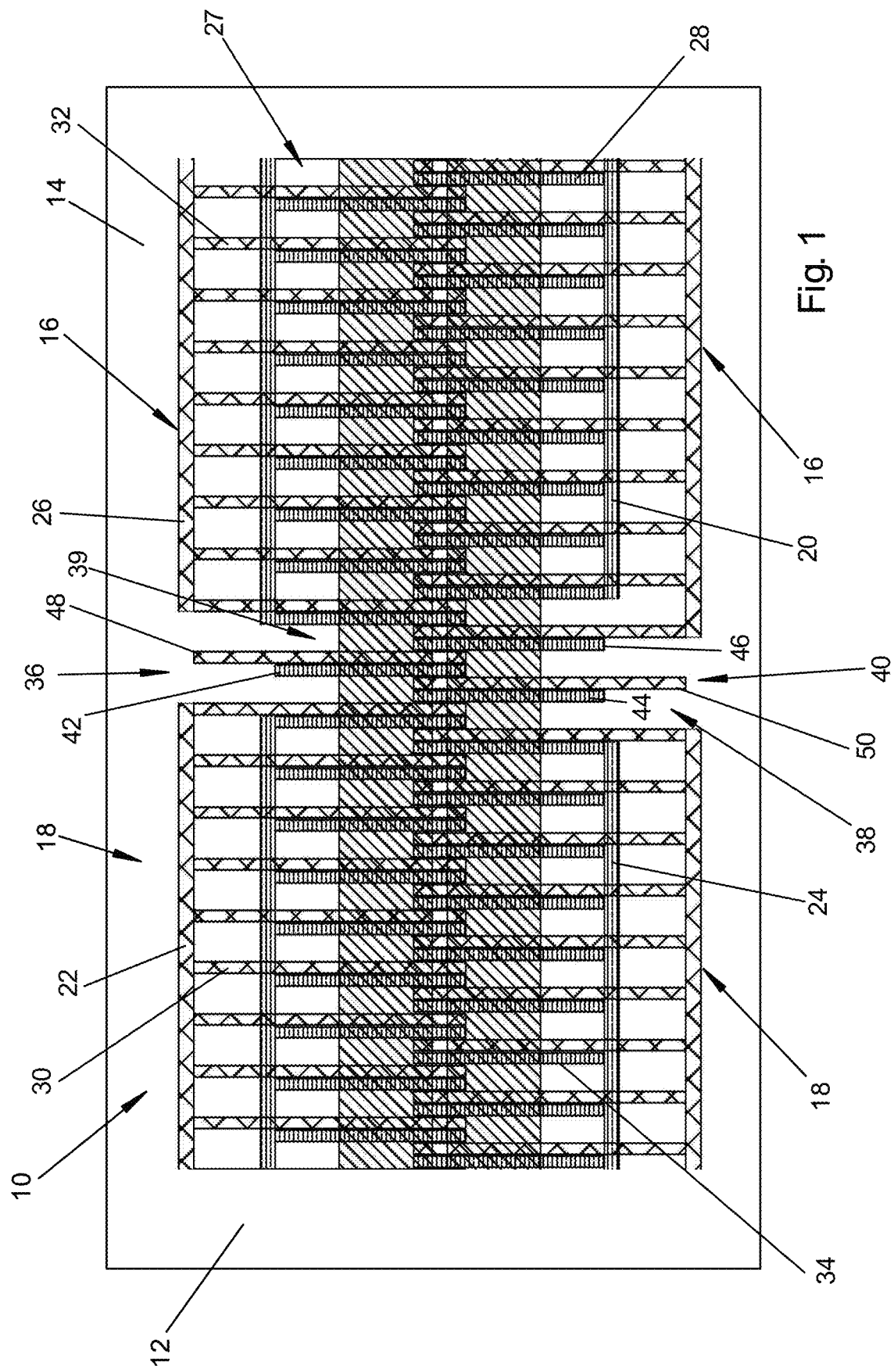
FIG. 1 shows a schematic top view of a section of an exemplary embodiment of an electronic component with a gate arrangement for manipulating the quantum state of a quantum dot or a charge carrier.

FIG. 1 shows a first exemplary embodiment of an electronic component 10, which is formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). Gate electrode assemblies 16, 18 are provided on a surface 14 of the substrate 12.

The gate electrode assemblies 16, 18 each have two gate electrodes 20, 22, 24, 26. The individual gate electrodes are electrically isolated from one another in a suitable manner with insulating layers 27. The gate electrode assemblies 16, 18, 40 are provided in layers, and one insulating layer 27 is provided between each gate electrode 20, 22, 24, 26 of the gate electrode assemblies 16, 18, 40. The gate electrodes 20, 22, 24, 26 further comprise electrode fingers 28, 30, 32, 34, which are arranged parallel to another on the surface 14 of the substrate 12.

In an adjacent region 36 where the gate electrode assemblies 16, 18 adjoin, a manipulation zone 38 is formed. A manipulator 39, which contains a further gate electrode assembly 40, is located in the manipulation zone 38. The gate electrode assembly 40 comprises gate electrodes 42, 44, 46, which form at least one static potential well. The gate electrode assembly 40 further comprises pump gate electrodes 48, 50, each of which can set a quantum dot or a charge carrier in motion or in oscillation.

The gate electrode assemblies 16, 18, 40 are supplied with a suitable voltage via electrical connections. By suitably applying sinusoidal voltages to the gate electrodes 20, 22, 24, 26 of the gate electrode assemblies 16, 18, a potential well is generated in the substrate 12. A quantum dot or charge carrier trapped in this potential well can thus be transported through the substrate. The potential well is transported longitudinally through the substrate through suitable control of the electrode fingers 28, 30, 32, 34 with sinusoidal voltages. The quantum dot or charge carrier confined in such a potential well can be transported with this potential well over a greater distance in the two-dimensional electron gas of the substrate 12 made of SiGe without experiencing a quantum mechanical change of state.

Figure 2:
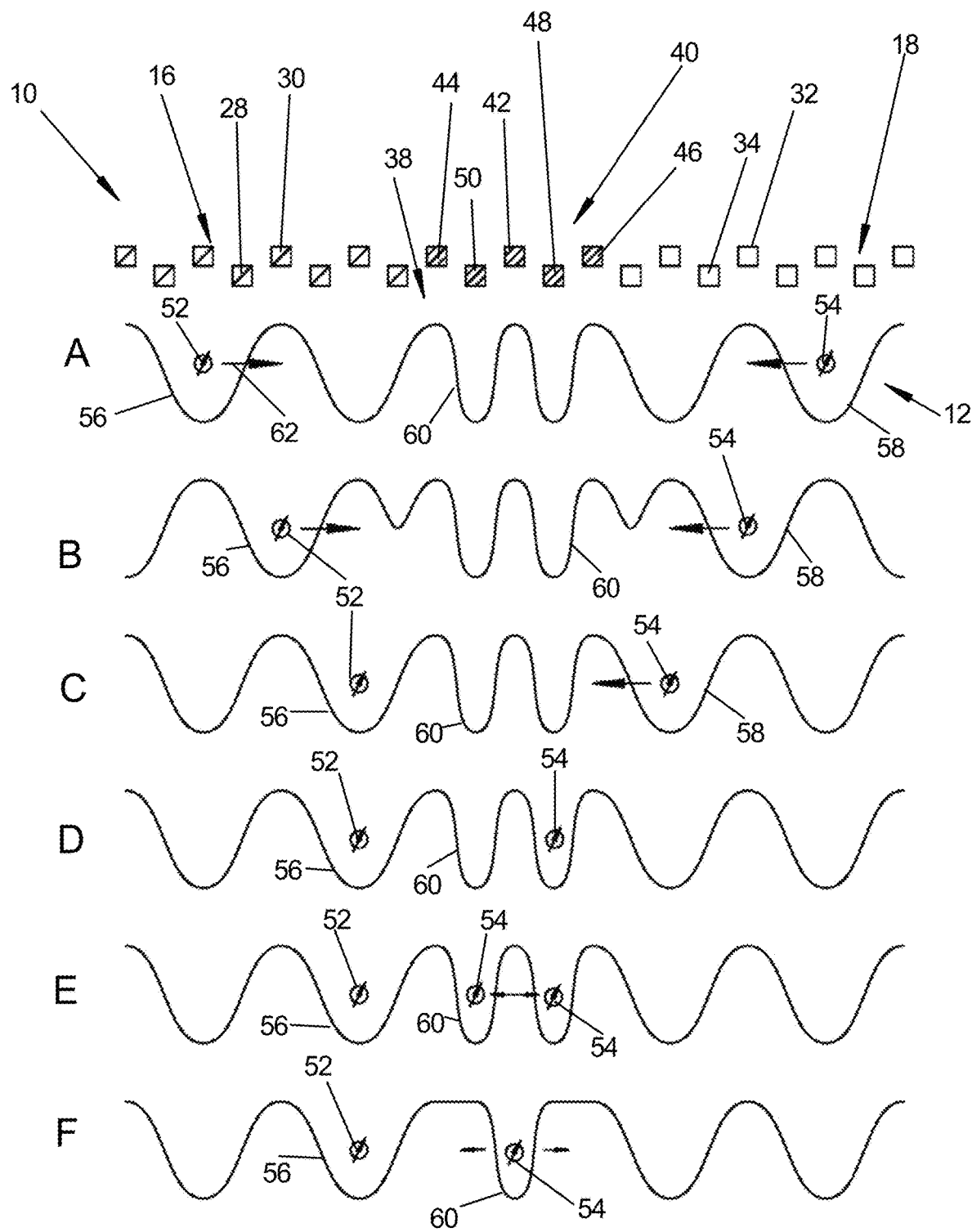
FIG. 2 shows a schematic diagram of the sequence of manipulation in the manipulation zone of a variant with gate electrode assemblies provided on both sides for two movable potential wells for single qubit operations.

FIG. 2 shows a schematic diagram of the sequence of manipulation of a quantum dot or charge carrier 52, 54 in the manipulation zone 38 for a single qubit operation. The diagram shows a section of the electronic component 10 so that only the electrode fingers 28, 30, 32, 34; the barrier gate electrodes 42, 44, 46; and the pump gate electrodes 48, 50 are visible in the section. Sequences from A to F of the positions of the potential wells 56, 58, 60 in the substrate 12 are shown below this to explain the function. The electrode fingers 28, 30, 32, 34 of the gate electrode assemblies 16, 18 form the movable potential wells 56, 58 through the substrate 12. The movement of the potential wells 56, 58 is effected by appropriately interconnecting the electrode fingers 28, 30, 32, 34. The electrode fingers 28, 30, 32, 34 of the gate electrode assembly 16, 18 provided for this purpose are periodically and alternately interconnected, which effects an almost continuous movement of the potential wells 56, 58 through the substrate 12.

A static double well 60 is formed in the manipulation zone 38. The static double well 60 is produced by the barrier gate electrodes 42, 44, 46. First, a quantum dot 54 is brought with the movable potential well 58 into the static double potential well 60 in the manipulation zone 38. The quantum dot 54 can assume a defined quantum mechanical state by the manipulator 39, for example a gradient magnetic field. Another quantum dot 52 waits outside the manipulation zone 38. A defined quantum state of the quantum dot 54 is achieved through movement in the magnetic field gradient of the manipulator 39. It is now the possible to have the quantum dot 54 assume a defined quantum state through delocalization in the double well (E) or through rapid back and forth motions in the magnetic field gradient (F). The quantum dots 52, 54 brought out of the manipulation zone 38 assume defined quantum mechanical states in this manner.

Figure 3:
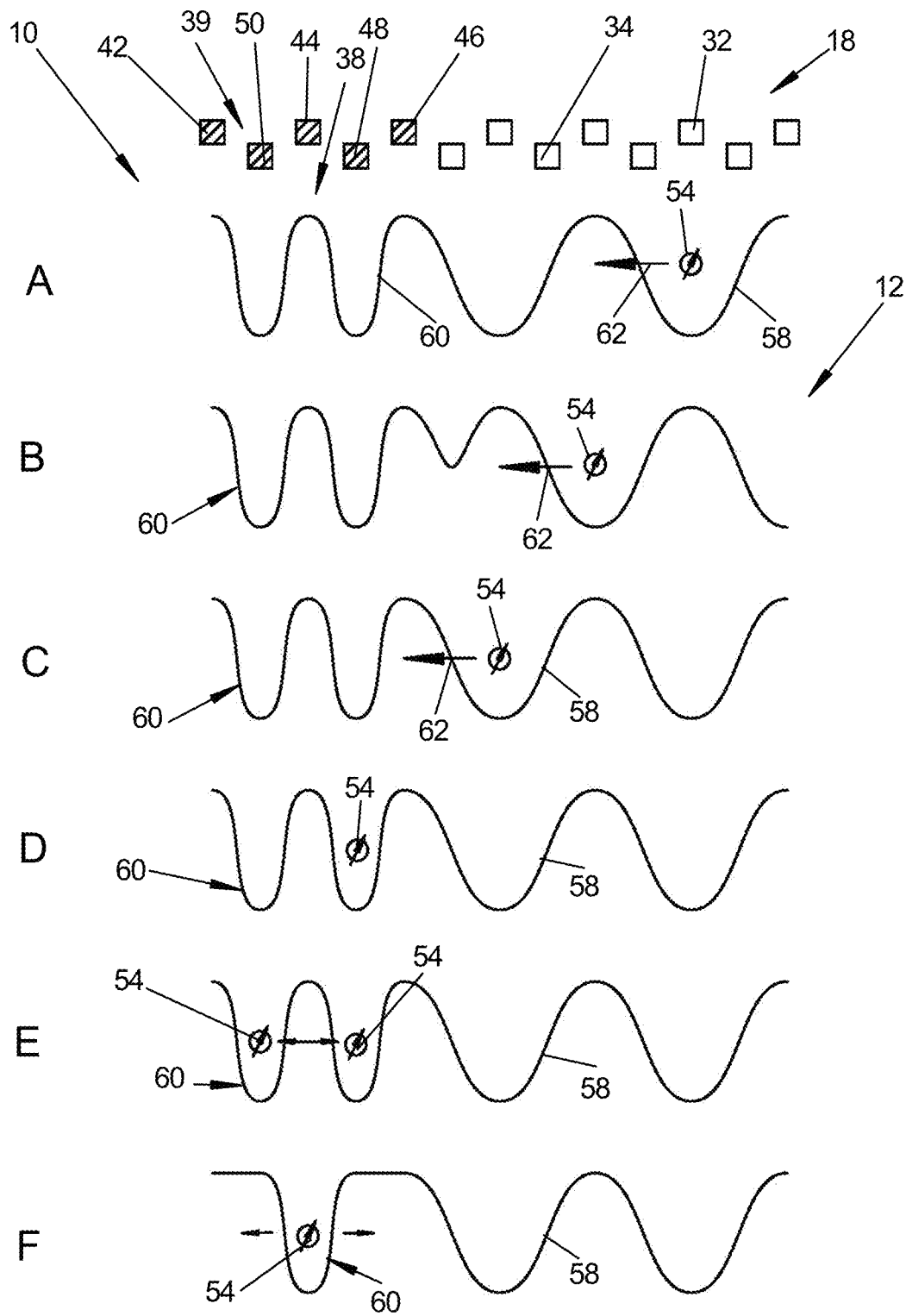
FIG. 3 shows a schematic diagram of the sequence of manipulation in the manipulation zone of a variant with gate electrode assemblies provided on one side for one movable potential well for single qubit operations.

FIG. 3 shows a schematic diagram of the sequence of manipulation of a quantum dot or charge carrier 54 in the manipulation zone 38 for a single qubit operation. The diagram shows a section of the electronic component 10 so that only the electrode fingers 32, 34; the barrier gate electrodes 42, 44, 46; and the pump gate electrodes 48, 50 are visible in the section. Sequences from A to F of the positions of the potential wells 58, 60 in the substrate 12 are shown below this to explain the function. The electrode fingers 32, 34 of the gate electrode assembly 18 form the movable potential well 58 through the substrate 12. The movement of the potential well 58 is effected by appropriately interconnecting the electrode fingers 32, 34. The electrode fingers 32, 34 of the gate electrode assembly 18 provided for this purpose are periodically and alternately interconnected, which effects an almost continuous movement of the potential well 58 through the substrate 12.

The static double well 60 is formed in the manipulation zone 38. The static double well 60 is produced by the barrier gate electrodes 42, 44, 46. The quantum dot 54 is brought with the movable potential well 58 into the static double potential well 60 in the manipulation zone 38. The quantum dot 54 can assume a defined quantum mechanical state by the manipulator 39, for example a gradient magnetic field. A defined quantum state of the quantum dot 54 is achieved through movement in the magnetic field gradient of the manipulator 39. It is now the possible to have the quantum dot 54 assume a defined quantum state through delocalization in the double well (E) or through rapid back and forth motions in the magnetic field gradient. The quantum dot 54 brought out of the manipulation zone 38 assumes a defined quantum mechanical state in this manner.

Figure 4:
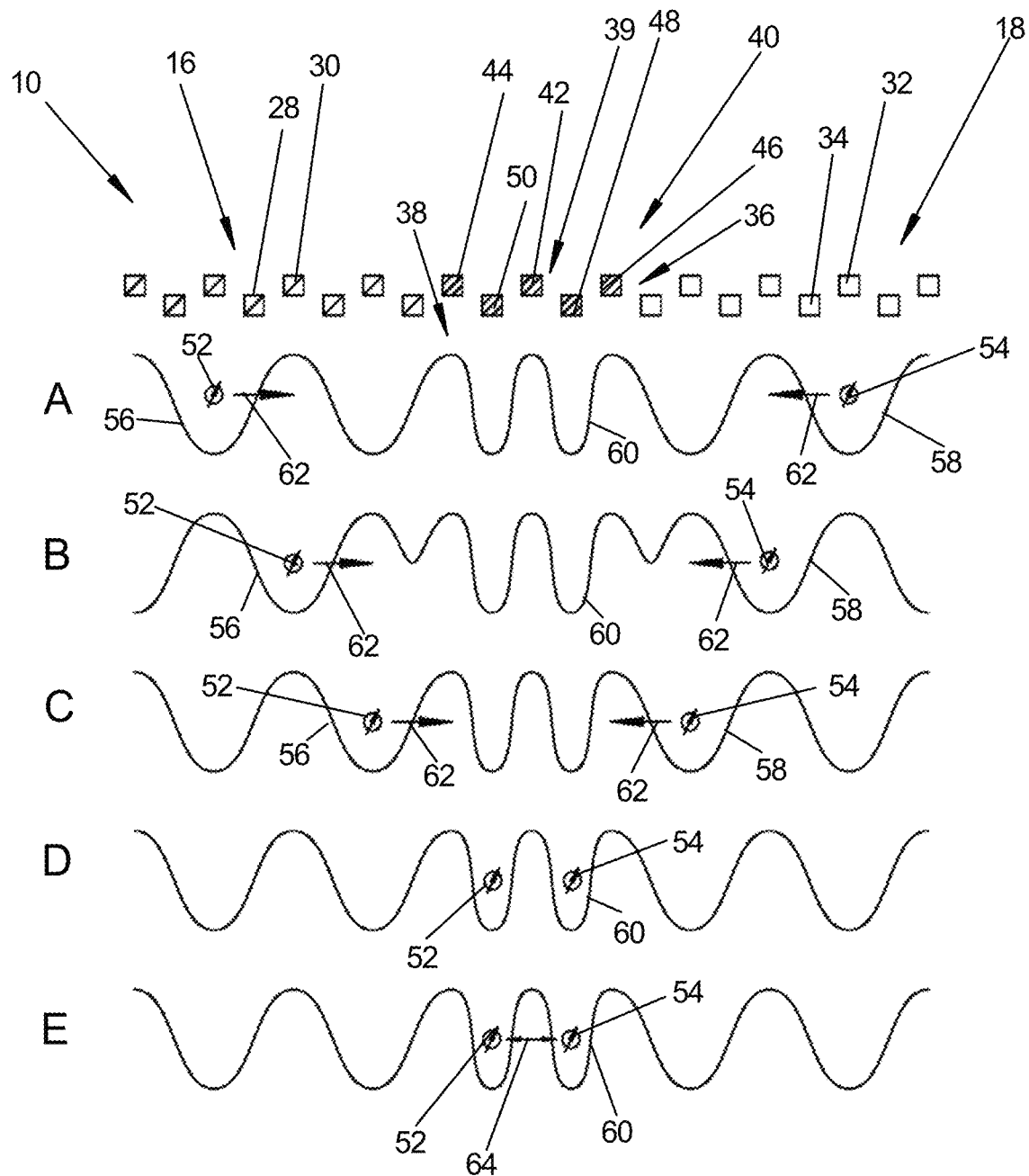
FIG. 4 shows a schematic diagram of the sequence of manipulation in the manipulation zone of a variant for two-qubit operations.

FIG. 4 shows a schematic diagram of the sequence of manipulation in the manipulation zone 38 of a further variant for two-qubit operations. The diagram shows a section of the electronic component 10 so that only the electrode fingers 28, 30, 32, 34; the barrier gate electrodes 42, 44, 46; and the pump gate electrodes 48, 50 are visible in the section. Sequences from A to E of the positions of the potential wells 56, 58, 60 in the substrate 12 are shown below this to explain the function. The electrode fingers 28, 30, 32, 34 of the gate electrode assemblies 16, 18 form the potential wells 56, 58, which can be moved through the substrate 12. The movement of the potential wells 56, 58 is effected by appropriately interconnecting the electrode fingers 28, 30, 32, 34. The electrode fingers 28, 30, 32, 34 of the gate electrode assembly 16, 18 provided for this purpose are periodically and alternately interconnected, which effects an almost continuous movement of the potential wells 56, 58 through the substrate 12.

The static double well 60 is formed in the manipulation zone 38. The static double well 60 is produced in this case as well by the barrier gate electrodes 42, 44, 46. The quantum dots 52, 54 are transported with the movable potential wells 56, 58 to the static double potential well 60 in the manipulation zone 38 and are each brought into the double potential well 60. The quantum dots 52, 54 can assume a defined quantum mechanical state by the manipulator 39, for example a gradient magnetic field. Via exchange interaction 64, two-qubit operations can be carried out between the quantum dots 52, 54. The quantum dots 52, 54 brought out of the manipulation zone 38 assume defined quantum mechanical states in this manner.

LIST OF REFERENCE SIGNS

10 Electronic component
12 Substrate
14 Surface
16 Gate electrode assembly
18 Gate electrode assembly
20 Gate electrode
22 Gate electrode
24 Gate electrode
26 Gate electrode
27 Insulating layer
28 Electrode fingers
30 Electrode fingers
32 Electrode fingers
34 Electrode fingers
36 Adjacent region
38 Manipulation zone
39 Manipulator
40 Gate electrode assembly
42 Barrier gate electrodes
44 Barrier gate electrodes
46 Barrier gate electrodes
48 Pump gate electrodes
50 Pump gate electrodes
52 Quantum dot
54 Quantum dot
56 Movable potential well
58 Movable potential well
60 Static double well
62 Horizontal arrows
64 Horizontal double arrow

The invention claimed is:

1. An electronic component, which is formed by a semiconductor component having gate electrode assemblies for manipulating a quantum state of qubits in quantum dots, comprising:

a substrate with a two-dimensional electron gas or electron hole gas;
electrical contacts for connecting the gate electrode assemblies to voltage sources;
a first gate electrode assembly having gate electrodes, which is arranged on a surface of the electronic component, for producing a potential wells in the substrate;
a second gate electrode assembly for generating a potential barrier, which is adjacent to the first gate electrode assembly;
parallel electrode fingers being part of the gate electrode assemblies, the electrode fingers of the first gate electrode assembly being periodically and alternately interconnected, which effects an almost continuous movement of the potential wells through the substrate; and
a manipulator that sets the qubit to a definable quantum state in a manipulation zone,
wherein the manipulation zone is provided in an adjacent region, which is formed by the first and second gate electrode assembly.

2. The electronic component according to claim 1, further comprising a switch adapted to switch a magnetic field for splitting electronic states with respect to their quantum mechanical states in the quantum dots.

3. The electronic component according to claim 1, wherein the manipulator comprises a magnetic field generator adapted to generate an oscillating magnetic field or a gradient magnetic field in the manipulation zone.

4. The electronic component according to claim 1, wherein the manipulator comprises a microwave generator, which radiates microwaves into the manipulation zone to manipulate the quantum state of the quantum dot.

5. The electronic component according to claim 1, wherein the manipulator comprises a third gate electrode assembly with gate electrodes for transporting a quantum dot by a potential well, which is arranged adjacent to a surface of the electronic component and to the manipulation zone.

6. The electronic component according to claim 5, wherein the third gate electrode assembly in the region adjacent to the manipulation zone has a fourth gate electrode assembly.

7. The electronic component according to claim 1, wherein the first and third gate electrode assembly each comprise two parallel gate electrodes, which form a channel structure.

8. The electronic component according to claim 1, wherein the substrate of the electronic component comprises gallium arsenide (GaAs) and/or silicon germanium (SiGe).

9. The electronic component according to claim 1, wherein the respectively interconnected gate electrodes are configured such that a periodic and/or phase-shifted voltage can be applied to them.

10. The electronic component according to claim 1, wherein every third electrode finger is connected to a gate electrode.

11. The electronic component according to claim 1, further comprising connections for connecting one or two qubits of a quantum computer.

12. A method, comprising:
providing an electronic component which is formed by a semiconductor component having gate electrode assemblies for manipulating a quantum state of qubits in quantum dots, including a substrate with a two-dimensional electron gas or electron hole gas;
electrical contacts for connecting the gate electrode assemblies to voltage sources;
a first gate electrode assembly having gate electrodes, which is arranged on a surface of the electronic component, for producing a potential wells in the substrate;
a second gate electrode assembly for generating a potential barrier, which is adjacent to the first gate electrode assembly;
parallel electrode fingers being part of the gate electrode assemblies, the electrode fingers of the first gate electrode assembly being periodically and alternately interconnected, which effects an almost continuous movement of the potential wells through the substrate; and
a manipulator that sets the qubit to a definable quantum state in a manipulation zone,
wherein the manipulation zone is provided in an adjacent region, which is formed by the first and second gate electrode assembly; and
moving the quantum dot or the quantum dots into and out of the manipulation zone by the first or third gate electrode assembly, respectively.

13. A method, comprising:
providing an electronic component which is formed by a semiconductor component having gate electrode assemblies for manipulating a quantum state of qubits in quantum dots, including
a substrate with a two-dimensional electron gas or electron hole gas;
electrical contacts for connecting the gate electrode assemblies to voltage sources;
a first gate electrode assembly having gate electrodes, which is arranged on a surface of the electronic component, for producing a potential wells in the substrate;
a second gate electrode assembly for generating a potential barrier, which is adjacent to the first gate electrode assembly;
parallel electrode fingers being part of the gate electrode assemblies, the electrode fingers of the first gate electrode assembly being periodically and alternately interconnected, which effects an almost continuous movement of the potential wells through the substrate; and
a manipulator that sets the qubit to a definable quantum state in a manipulation zone,
wherein the manipulation zone is provided in an adjacent region, which is formed by the first and second gate electrode assembly, and
wherein the respectively interconnected gate electrodes are configured such that a periodic and/or phase-shifted voltage can be applied to them; and
moving the quantum dot or the quantum dots into the manipulation zone for an exchange interaction.

14. A method, comprising:
providing an electronic component which is formed by a semiconductor component having gate electrode assemblies for manipulating a quantum state of qubits in quantum dots, including
a substrate with a two-dimensional electron gas or electron hole gas;
electrical contacts for connecting the gate electrode assemblies to voltage sources;
a first gate electrode assembly having gate electrodes, which is arranged on a surface of the electronic component, for producing a potential wells in the substrate;

a second gate electrode assembly for generating a potential barrier, which is adjacent to the first gate electrode assembly;

parallel electrode fingers being part of the gate electrode assemblies, the electrode fingers of the first gate electrode assembly being periodically and alternately interconnected, which effects an almost continuous movement of the potential wells through the substrate; and a manipulator that sets the qubit to a definable quantum state in a manipulation zone, wherein the manipulation zone is provided in an adjacent region, which is formed by the first and second gate electrode assembly, and wherein the respectively interconnected gate electrodes are configured such that a periodic and/or phase-shifted voltage can be applied to them;

moving the quantum dot within a magnetic gradient field back and forth to manipulate a qubit in the manipulation zone.

\* \* \* \* \*